(12) United States Patent
Miyauchi et al.

(10) Patent No.: US 12,261,469 B2
(45) Date of Patent: Mar. 25, 2025

(54) ELECTRIC DEVICE

(71) Applicant: HOSIDEN CORPORATION, Osaka (JP)

(72) Inventors: Kiyotaka Miyauchi, Osaka (JP); Eiji Sato, Osaka (JP)

(73) Assignee: Hosiden Corporation, Osaka (JP)

(*) Notice: Subject to any disclaimer, the term of this patent is extended or adjusted under 35 U.S.C. 154(b) by 20 days.

(21) Appl. No.: 18/140,754

(22) Filed: Apr. 28, 2023

(65) Prior Publication Data

US 2023/0378788 A1    Nov. 23, 2023

(30) Foreign Application Priority Data

May 17, 2022  (JP) ................. 2022-080913

(51) Int. Cl.
| | |
|---|---|
| G01D 5/14 | (2006.01) |
| H01F 7/02 | (2006.01) |
| H02J 7/00 | (2006.01) |
| H05K 5/00 | (2025.01) |
| H05K 5/02 | (2006.01) |

(52) U.S. Cl.
CPC ............ *H02J 7/0063* (2013.01); *G01D 5/14* (2013.01); *H01F 7/02* (2013.01); *H05K 5/0086* (2013.01); *H05K 5/0217* (2013.01)

(58) Field of Classification Search
CPC ........ H02J 7/0063; H02J 9/005; H02J 7/0032; H02J 7/0031; H02J 7/007; H02J 9/061; G01D 5/14; G01D 5/145; G01D 5/34; H01F 7/02; H05K 5/0086; H05K 5/0217; H05K 5/069; G09F 13/22; G09F 2013/222; H04W 52/0274
See application file for complete search history.

(56) References Cited

U.S. PATENT DOCUMENTS

| | | | | |
|---|---|---|---|---|
| 2016/0124248 A1* | 5/2016 | Humphreys | ............ | H02J 9/005 351/158 |
| 2017/0126053 A1* | 5/2017 | Lai | .......... | H02J 9/061 |

FOREIGN PATENT DOCUMENTS

| | | |
|---|---|---|
| EP | 3018790 A1 | 5/2016 |
| JP | 2017-69080 A | 4/2017 |
| JP | 2019-23599 A | 2/2019 |

OTHER PUBLICATIONS

Search Report issued Oct. 16, 2023 in European appln. No. 23170958.

* cited by examiner

*Primary Examiner* — Elim Ortiz

(74) *Attorney, Agent, or Firm* — Dilworth & Barrese, LLP; Michael J. Musella, Esq.

(57) ABSTRACT

An electric device includes: an electric circuit; a power supply circuit configured to feed electric power to the electric circuit and stop the feed; and a housing containing the electric circuit and the power supply circuit. The power supply circuit is configured to, in response to a first operation performed from outside the housing while the power supply circuit is in an OFF state, the OFF state being a state in which the battery feeds no electric power to the electric circuit, transition to an ON state, the ON state being a state in which the battery continuously feeds electric power to the electric circuit even after an end of the first operation, and in response to a second operation performed while the power supply circuit is in the ON state, transition to the OFF state.

16 Claims, 4 Drawing Sheets

ELECTRIC DEVICE

CROSS REFERENCE TO RELATED APPLICATION

This application is based on and claims priority under 35 U.S.C. Section 119 to Japanese Patent Application No. 2022-080913 filed on May 17, 2022, the entire content of which are incorporated herein by reference.

TECHNICAL FIELD

This disclosure relates to an electric device.

BACKGROUND ART

JP2019-23599A discloses an electric water level display device including a water level sensor configured to detect a water level, a water level display board configured to display the water level, and an alarm device.

The electric water level display device further uses (i) a storage battery rechargeable through solar photovoltaic power generation as a power source and (ii) an inorganic EL panel as the water level display board. The electric water level display device controls how the water level display board and the alarm device operate in accordance with, for example, a change in the water level and the ambient brightness to save electric power with the use of the storage battery.

JP2017-69080A discloses an electronic device including a housing and a switch. Performing a predetermined operation on the switch turns the electronic device on and off.

The electronic device further includes (i) a first permanent magnet ("first ferromagnet") provided for an operation section of the switch and holding the operation section in such a manner that the switch is slidable relative to the housing, (ii) a second permanent magnet ("second ferromagnet") movable together with the first permanent magnet, and (iii) a sheet between the first and second permanent magnets. The electronic device further includes a pair of magnetic sensors configured to detect the position of the second permanent magnet to detect the position of the operation section.

SUMMARY

Electronic devices such as wearable devices and IoT (Internet of Things) devices include electric devices, which are energized by a battery and which are usable only over a time period limited by the capacity of the battery.

The above issue may be addressed by, for instance, managing how a control target operates as disclosed in JP2019-23599A to save electric power. Such management, however, produces only a limited power-saving effect if the battery keeps feeding electric power (that is, applying a voltage) to the control target.

Portable electronic devices typically include a substrate and the like in a hermetic housing for protection against water and dust. Such a housing may be provided with a switch configured to turn off the battery to save electric power. If, however, an electronic device requires, for example, a sheet between the movable portion of a switch and a substrate as in JP2017-69080A, the structure may become complex and involve a large number of parts.

The above circumstances have led to a demand for an electric device that allows a reduction in the consumption of electric power of a battery.

An electric device according to this disclosure characteristically includes: an electric circuit; a power supply circuit configured to feed electric power to the electric circuit and stop the feed; and a housing containing the electric circuit and the power supply circuit in an internal space (S), the power supply circuit including: a battery; and an output controller configured to control an output of the battery, the output controller being configured to, in response to a first operation performed from outside the housing while the power supply circuit is in an OFF state, the OFF state being a state in which the battery feeds no electric power to the electric circuit, cause the power supply circuit to transition to an ON state, the ON state being a state in which the battery continuously feeds electric power to the electric circuit even after an end of the first operation, and in response to a second operation performed while the power supply circuit is in the ON state, cause the power supply circuit to transition to the OFF state.

The electric device according to this disclosure is, with the above configuration, configured to (i) in response to a first operation from outside the housing, cause the output controller of the power supply circuit to transition from the OFF state to the ON state to cause the power supply circuit to feed electric power to the electric circuit and (ii) in response to a second operation, cause the output controller to transition from the ON state to the OFF state to cause the power supply circuit to stop feeding electric power to the electric circuit. The above configuration, in other words, allows the power supply circuit to start feeding electric power to the electric circuit at any time point and to stop the feed at any time point without requiring a direct operation of the power supply circuit inside the housing. This helps to reduce the consumption of electric power of the battery. The electric device therefore allows a reduction in the consumption of electric power of a battery.

The electric device may further be configured such that the housing is hermetically structured to prevent liquid and dust from entering the internal space.

The hermetically structured housing prevents liquid and dust from coming into contact with the electric circuit, and thereby allows the electric device to operate appropriately.

The electric device may further be configured such that the output controller includes a magnetic sensor configured to detect magnetism, the first operation is an operation of bringing a magnet close to the magnetic sensor outside the housing, and the magnetic sensor functions as a switch configured to cause the output controller to transition to the ON state in response to detecting magnetism of the magnet when the magnet is close to the magnetic sensor.

With the above configuration, performing outside the housing the first operation of bringing a magnet close to the magnetic sensor causes the magnetic sensor to detect magnetism of the magnet and cause the output controller to transition to the ON state, thereby feeding electric power from the battery to the electric circuit.

The electric device may further be configured such that the housing has a recess configured to receive the magnet such that inserting the magnet into the recess brings the magnet close to the magnetic sensor.

With the above configuration, inserting the magnet into the recess brings the magnet close to the magnetic sensor to cause the output controller to transition to the ON state. Further, the recess in the housing, as compared to a through hole, does not impair hermeticity of the housing.

The electric device may further be configured such that the recess is in a form of a cylinder including a bottom wall into and out of which cylinder the magnet is capable of being linearly inserted and pulled out, and the bottom wall is so positioned relative to the magnetic sensor, and the magnet has a magnetic intensity so adjusted, that bringing the magnet into contact with the bottom wall causes the magnetism of the magnet to act on the magnetic sensor to cause the output controller to transition to the ON state.

With the above configuration, inserting the magnet into the recess linearly until the magnet comes into contact with the bottom wall causes the output controller to transition to the ON state. This allows the user to, when using the magnet, reliably perceive the transition to the state of the power supply circuit feeding electric power to the electric circuit.

The electric device may further be configured such that the housing is provided with a shutter configured to, when the magnet is not in the recess, block an opening of the recess and, when the magnet is being into the recess, change an orientation in such a manner as to allow the magnet to be inserted into the recess.

The shutter is configured to, when the magnet is not in the recess, block the opening of the recess to prevent dust and the like from entering the recess. The shutter is also configured to, when the magnet is being inserted into the recess, change its orientation in such a manner as to allow the magnet to be inserted into the recess, thereby eliminating the need to manually move the shutter.

The electric device may further be configured such that the electric circuit includes: a data collector configured to collect data; and a wireless communicator configured to transmit, to an external device outside the housing, a radio signal indicative of the data that the data collector has collected.

The above configuration allows the wireless communicator to transmit, to an external device, information that the data collector has collected.

The electric device may further be configured such that a notifier configured for notification that the power supply circuit has transitioned to the ON state.

The above configuration allows the user to perceive on the basis of the notifier that the power supply circuit has transitioned to the ON state. In the case where the notifier is, for example, a light-emitting diode or a liquid crystal display device, the user is able to easily perceive that the power supply circuit has transitioned to the ON state on the basis of light emitted by the light-emitting diode or an icon or the like displayed by the liquid crystal display device.

The electric device may further be configured such that an OFF control component disposed on an outer surface of the housing and configured to cause the output controller to transition from the ON state to the OFF state in response to receiving a voltage signal, wherein the second operation is an operation of inputting the voltage signal into the OFF control component from outside the housing.

With the above configuration, inputting a voltage signal into the OFF control component on the outer surface of the housing causes the output controller to transition to the OFF state. The above configuration, in particular, does not lead to a mechanical breakdown or a decrease in the hermeticity of the housing, as opposed to a configuration that involves operating something movable such as a switch.

The electric device may further be configured such that the output controller includes an optical sensor configured to detect a light beam, and the first operation is an operation of causing the output controller to cause the optical sensor to detect a light beam from a light source outside the housing.

With the above configuration, causing the optical sensor inside the housing to detect, for example, a light beam from a light source outside the housing causes the output controller to cause the power supply circuit to transition to the ON state.

DESCRIPTION OF EMBODIMENTS

The description below deals with an embodiment of this disclosure with reference to drawings.

Basic Configuration

Figure 1:
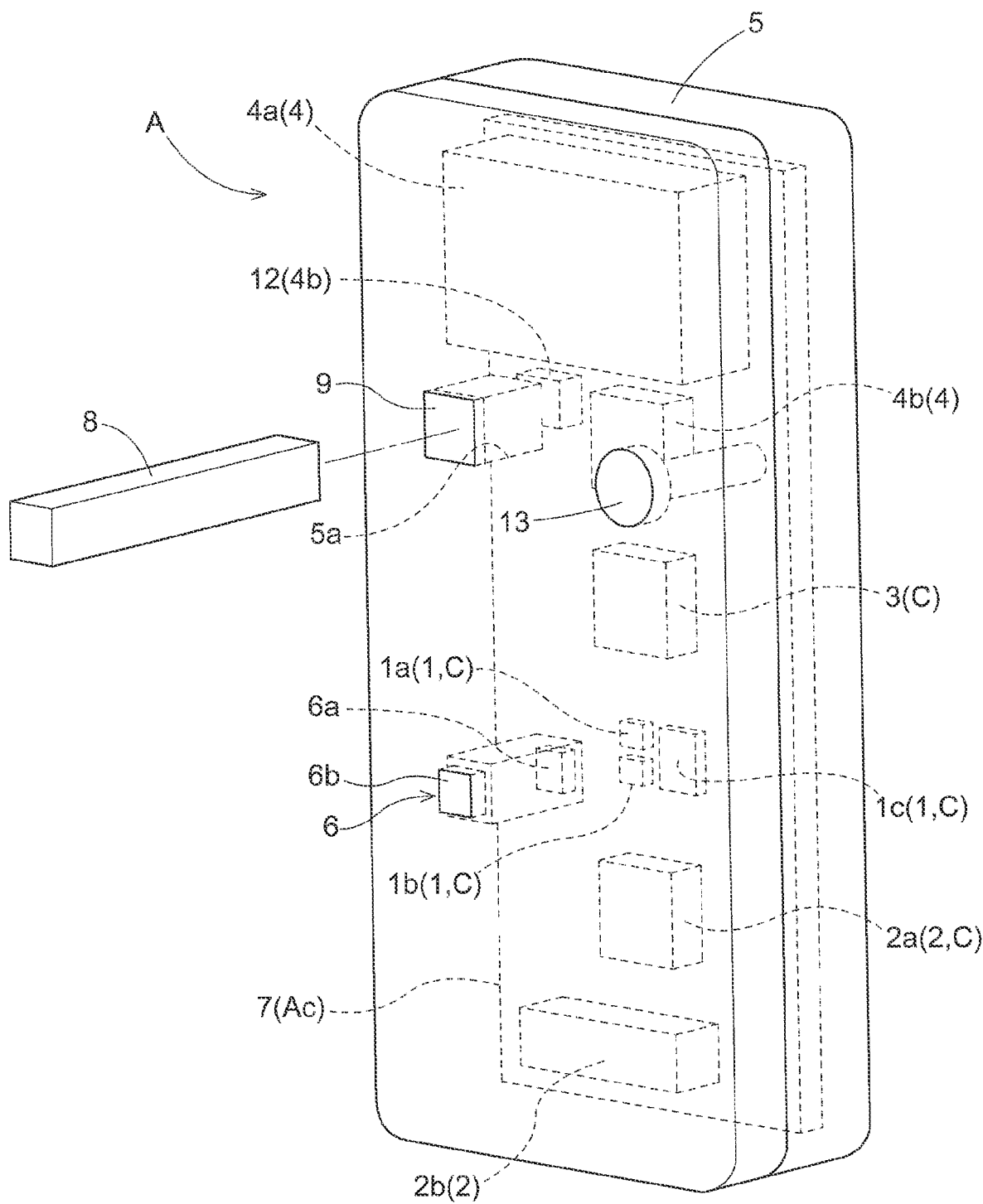
FIG. 1 is a perspective view of an information collector unit.
Figure 2:
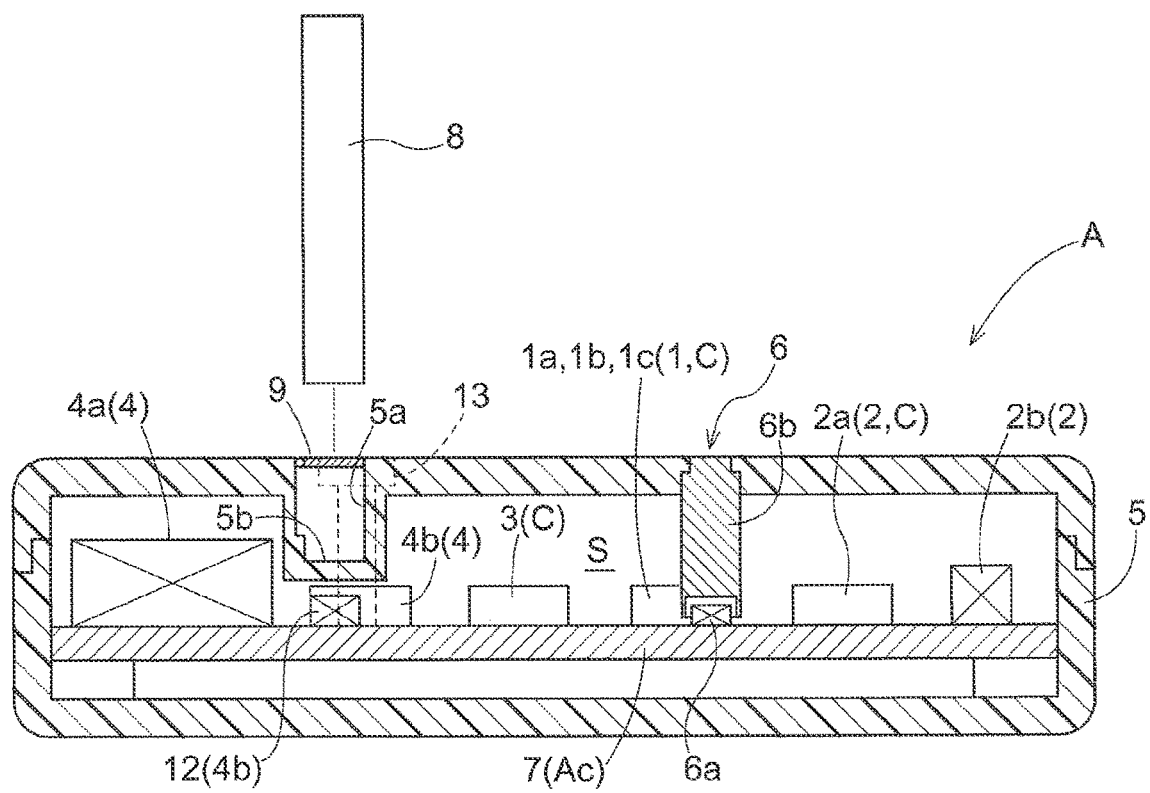
FIG. 2 is a cross-sectional view of an information collector unit.
Figure 4:
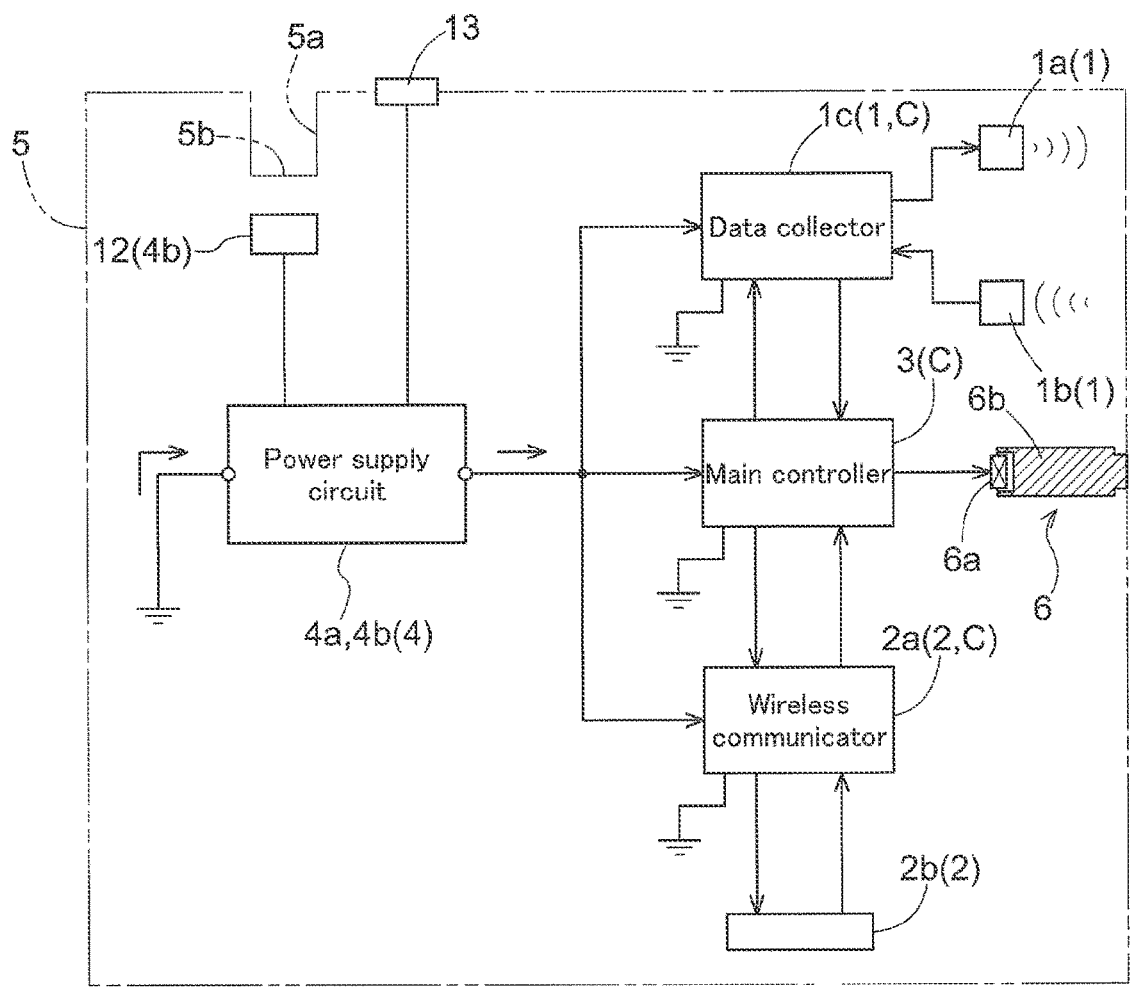
FIG. 4 is a circuit diagram illustrating elements configured to receive an output of a power supply circuit.

FIGS. 1, 2, and 4 each show a circuit module Ac including an electric circuit C and a power supply circuit 4 configured to feed electric power to the electric circuit C. The electric circuit C includes (i) a data collector 1 configured to collect data, (ii) a wireless communicator 2 configured to receive control information and transmit data that the data collector 1 has collected, and (iii) a main controller 3 configured to control the data collector 1 and the wireless communicator 2. The circuit module Ac is contained in the internal space S of a housing 5. The circuit module Ac and the housing 5 constitute an information collector unit A (which is an example of the "electric device").

The housing 5 is made of a nonmagnetic insulator such as a resin or a nonmagnetic metal, and is hermetically structured to prevent liquid and dust from entering the internal space S. The housing 5 has an outer surface provided with an indicator 6 (which is an example of the "notifier") configured to indicate an ON state, in that, that the power supply circuit 4 continuously feeds electric power to the electric circuit C. The indicator 6 is configured not to indicate that the power supply circuit 4 is in the ON state when the power supply circuit 4 is in an OFF state. The indicator 6 may alternatively be configured to, when the power supply circuit 4 is in the OFF state, be on to indicate so.

As illustrated in FIGS. 1 and 2, the indicator 6 includes (i) a light-emitting diode 6a on a substrate 7 in the housing 5 and (ii) a light guide 6b configured to guide a light beam from the light-emitting diode 6a to the outer surface of the housing 5. The light guide 6b is made of a transparent resin capable of guiding a light beam. The light guide 6b has an inner end close to the light-emitting diode 6a and an outer end disposed through an opening in the housing 5 and exposed to the outside.

The information collector unit A is configured such that the power supply circuit 4 includes a battery 4a and an output controller 4b. The power supply circuit 4 is switchable between an ON state, in which the output controller 4b causes the battery 4a to continuously feed electric power to the electric circuit C, and an OFF state, in which the output controller 4b prevents the battery 4a from feeding electric power to the electric circuit C. The power supply circuit 4 will be detailed later.

The power supply circuit 4 is configured such that the battery 4a feeds electric power to the data collector 1, the wireless communicator 2, and the main controller 3 under control of the output controller 4b.

The information collector unit A is designed for use in an environment in which a commercial power source is difficult to use, such as outdoors. The circuit module Ac of the information collector unit A is also usable in a portable electric appliance or the like for indoor use in a general household.

The information collector unit A is designed as a water gauge for outdoor use. The information collector unit A is, however, not necessarily a water gauge; it may be configured such that the data collector 1 performs a sensing operation such as measuring the distance between the information collector unit A and a target object or determining whether a target object is present or absent and that the wireless communicator 2 transmits information that the data collector 1 has collected to an external device by means of a radio wave.

For such use, the information collector unit A is configured as illustrated in FIGS. 1, 2, and 4 such that the data collector 1 includes a sensor controller 1c and that the wireless communicator 2 includes a transmission and reception circuit 2a. The sensor controller 1c, the transmission and reception circuit 2a, the main controller 3, and the power supply circuit 4 are on the substrate 7 in the housing 5. The information collector unit A may be configured such that one or more of the functions of the data collector 1 and the wireless communicator 2 are performed by the main controller 3 (including software). Further, the information collector unit A is not necessarily configured such that the sensor controller 1c, the transmission and reception circuit 2a, the main controller 3, and the power supply circuit 4 are all on a single substrate 7; it may alternatively be configured such that the four elements are on a plurality of substrates 7, for instance, such that one or more of the four elements are on a secondary substrate.

The data collector 1 includes, inside the housing 5, (i) a millimeter wave transmitter 1a configured to transmit millimeter waves out of the housing 5, (ii) a millimeter wave receiver 1b configured to receive millimeter waves, and (iii) a sensor controller 1c configured to control the millimeter wave transmitter 1a and the millimeter wave receiver 1b. The sensor controller 1c may be built in, for example, an application-specific integrated circuit (ASIC) configured to receive a millimeter wave signal and convert the millimeter wave signal into a predetermined digital signal. The transmitters 1a and 1b may also be built in the ASIC together with the sensor controller 1c. Since the data collector 1 uses millimeter waves as above, the housing 5 should desirably be made of a resin that allows millimeter waves to pass therethrough.

The wireless communicator 2 includes, inside the housing 5, (i) a transmission and reception circuit 2a configured for transmission and reception of electric wave signals and (ii) an antenna 2b configured to transmit and receive electric wave signals. The antenna 2b may alternatively be disposed outside the housing 5, and may also be a pattern antenna formed on an inner surface of the housing 5 by attaching a plurality of antenna sheets to one another and, for example, plating the attached product.

The main controller 3 is in the form of, for example, a microprocessor or a digital signal processor (DSP), and is configured to execute programs to control the data collector 1 and the wireless communicator 2.

The information collector unit A (specifically, the circuit module Ac) receives control information in the form of a radio signal from an external device with use of the antenna 2b. The control information allows the information collector unit A to, for example, (i) set when to start or stop data collection and sensing intervals and (ii) send out collected data in real time or in units of multiple data items at set intervals.

Power Supply Circuit

Figure 3:
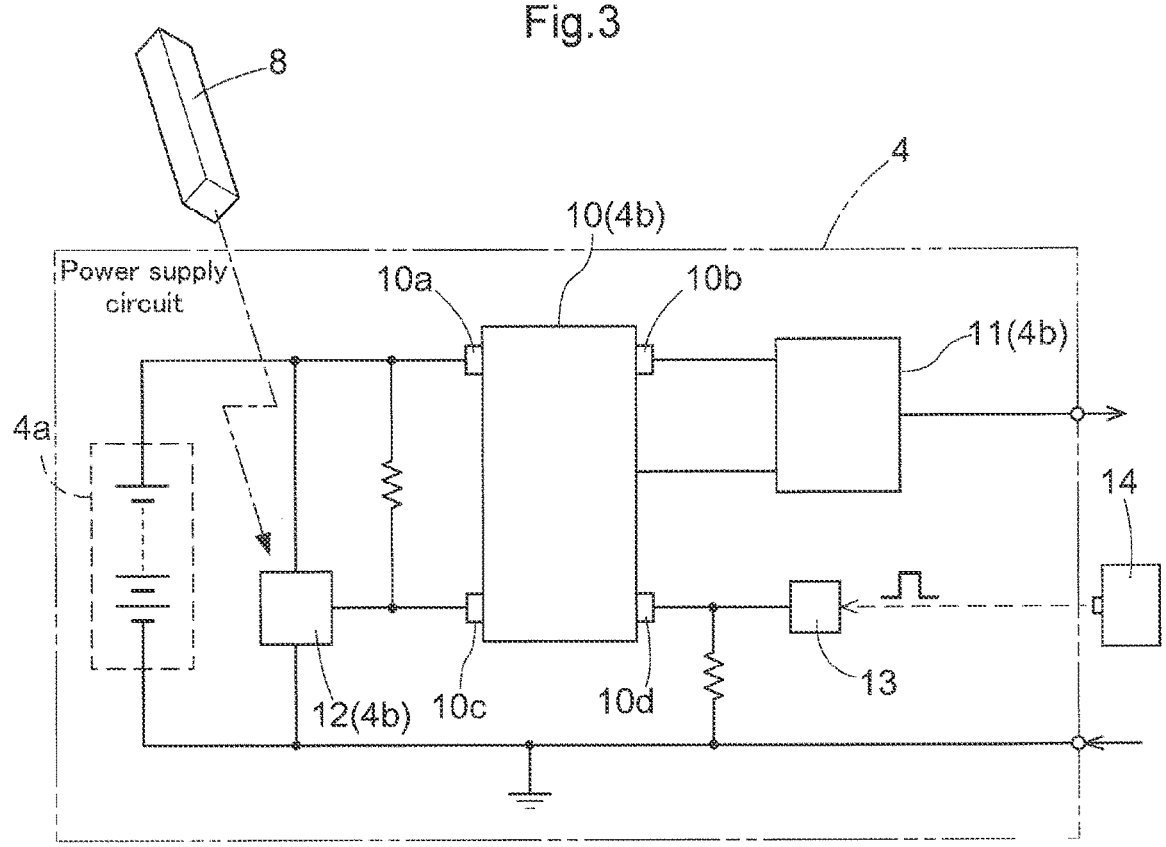
FIG. 3 is a circuit diagram illustrating a power supply circuit.

The power supply circuit 4 is configured to feed electric power to the electric circuit C (specifically, the data collector 1, the wireless communicator 2, and the main controller 3) and stop the feed. The power supply circuit 4, as illustrated in FIGS. 2 and 3, includes a battery 4a and an output controller 4b configured to control the battery 4a for starting and stopping the electric power feed. The output controller 4b is configured to, in response to a first operation, switch the power supply circuit 4 from an OFF state, in which the battery 4a feeds no electric power to the electric circuit C, to an ON state, in which the battery 4a continuously feeds electric power to the electric circuit C.

The power supply circuit 4 is configured to (i) start feeding electric power to the electric circuit C at a time point based on a first operation by the user and (ii) stop feeding electric power to the electric circuit C at a time point based on a second operation by the user. The second operation is, in particular, not identical or similar to the first operation such as a repetition of the first operation or its reverse: The second operation is clearly distinct from the first operation to prevent an error.

The output controller 4b includes a power keep circuit 10 illustrated in FIG. 3, a regulator 11 configured to maintain the output voltage, and a Hall device 12 (which is an example of the "magnetic sensor").

The power keep circuit 10 allows the power supply circuit 4 to transition to the ON state in response to a first operation that the user performs with use of a permanent magnet 8 (which is an example of the "magnet") illustrated in FIGS. 2 and 3 from outside the housing 5 without touching a switch in the housing 5. The information collector unit A is configured such that the power supply circuit 4 is capable of transitioning to the ON state in response to an operation performed from outside the housing 5 as described above. This ensures hermeticity as compared to, for example, the case of the user mechanically operating a switch in a housing from outside the housing.

The power keep circuit 10 is in the form of a packaged circuit including semiconductor devices. The power keep circuit 10, as illustrated in FIG. 3, includes an input terminal 10a, an output terminal 10b, an ON terminal 10c, and an OFF terminal 10d. The input terminal 10a receives electric power from the battery 4a. The output terminal 10b outputs an output. The ON terminal 10c receives a control signal (that is, a zero-potential signal) for the transition to the ON state (that is, an energized state). The OFF terminal 10d receives a signal (that is, a positive-potential signal) for the transition to the OFF state (that is, a non-energized, shutdown state).

The power keep circuit 10 illustrated in FIG. 3 is configured such that connecting a terminal of the Hall device 12 to the ON terminal 10c brings the permanent magnet 8 close to the Hall device 12 (which is an example of the "magnetic sensor") to cause the ON terminal 10c to have an ON potential and thereby cause the power supply circuit 4 to transition to the ON state. The power keep circuit 10 is configured such that the power supply circuit 4 remains in the ON state after the user brings the permanent magnet 8 away from the Hall device 12 so that the input terminal 10*a* has its original potential. The Hall device 12, as described above, functions as a switch configured to cause the input terminal 10*a* to have an ON potential in response to detecting magnetism and thereby cause the power supply circuit 4 to transition to the ON state.

As illustrated in FIG. 3, the power supply circuit 4 includes an OFF control component 13 in the form of a bar made of a good electric conductor such as copper. The OFF control component 13 has a first end connected to the OFF terminal 10*d* of the power keep circuit 10 on the substrate 7 and a second end exposed from the housing 5 as illustrated in FIG. 1. This configuration allows the power supply circuit 4 to transition to the OFF state in response to the OFF control component 13 receiving (which is example control from outside the housing 5), from a pulse generator circuit 14 outside the housing 5, a pulse signal (which is an example of the "voltage signal") with a voltage equal to or higher than the voltage of the battery 4*a*. The present embodiment may alternatively be configured such that the OFF control component 13 receives not a pulse signal but a constant voltage equal to the voltage of the battery 4*a*.

Power Supply Circuit Transitioning to ON State

As illustrated in FIG. 2, the housing 5 has a recess 5*a* in the shape of a bottomed cylinder configured to receive a bar-shaped permanent magnet 8. The information collector unit A is configured as follows: The bottom wall 5*b* of the recess 5*a* is so positioned relative to the Hall device 12, and the permanent magnet 8 has a magnetic intensity so adjusted, that inserting the permanent magnet 8 into the recess 5*a* and bringing it into contact with the bottom wall 5*b* decreases the voltage applied to the ON terminal 10*c* and thereby causes the power supply circuit 4 to transition to the energized state (that is, the ON state).

With the above configuration, inserting the permanent magnet 8 into the recess 5*a* (first operation) and bringing an end thereof into contact with the bottom wall 5*b* causes the power keep circuit 10 to cause the power supply circuit 4 to transition to the energized state (that is, the ON state). As described above, the power keep circuit 10 is configured to cause the power supply circuit 4 to (i) transition to the ON state in response to the action of the magnetism of the permanent magnet 8 and (ii) remain in the ON state after the user pulls the permanent magnet 8 out of the recess 5*a* so that the power keep circuit 10 no longer receives the action of the magnetism.

After the power supply circuit 4 transitions to the ON state, the main controller 3 causes the light-emitting diode 6*a* to emit light so that the light beam is visible from the side of the outer end of the light guide 6*b* (see FIG. 1). When the power supply circuit 4 is in the OFF state, the main controller 3 does not cause the light-emitting diode 6*a* to emit light. This configuration allows the user to perceive the state of the power supply circuit 4 on the basis of the state of the outer end of the light guide 6*b* of the indicator 6 (that is, whether the indicator 6 is emitting light).

Figure 5:
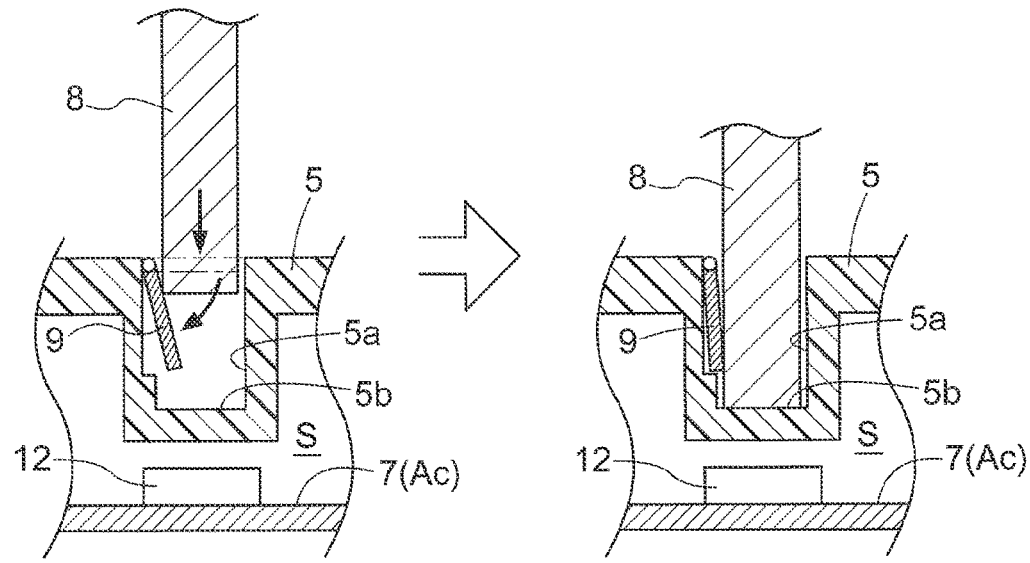
FIG. 5 is a cross-sectional diagram illustrating how a shutter changes its orientation in response to an insertion of a permanent magnet.

As illustrated in FIGS. 1 and 5, the information collector unit A includes a shutter 9 at the opening of the recess 5*a*. The shutter 9 is configured to, when the permanent magnet 8 is not inserted, block the opening due to the urging force of a spring (not illustrated in the drawings) and, when the permanent magnet 8 is being inserted, change its orientation against the urging force of the spring to allow the insertion. The shutter 9 is made of a ferromagnet such as iron so as to, when blocking the opening of the recess 5*a*, prevent the Hall device 12 from receiving a strong action of the magnetism of the permanent magnet 8 being close to the opening. The shutter 9 also serves to prevent dust from entering the recess 5*a*.

With the information collector unit A configured to allow the user to insert the permanent magnet 8 into the recess 5*a* to cause the magnetism to act on the Hall device 12, the permanent magnet 8 needs to be designed to have a particular magnetic pole (that is, either the north pole or the south pole) on a predetermined side. To that end, the information collector unit A may be configured such that the recess 5*a* has a cross-sectional shape corresponding to that of a first end of the permanent magnet 8 which first end has the intended magnetic pole so that only the first end of the permanent magnet 8 is insertable into the recess 5*a* (and its second end is not insertable). The information collector unit A may alternatively include a compact permanent magnet 8 fixed to a first end of a nonmagnetic bar such that the end (leading end) of the permanent magnet 8 has the intended magnetic pole and that the user is able to hold the second end of the nonmagnetic bar and insert it into the recess 5*a* to thereby insert the permanent magnet 8 thereinto. In the case of the Hall device 12 being bipolar, the permanent magnet 8 does not need to be designed to have a particular magnetic pole on a predetermined side.

Power Supply Circuit Transitioning to OFF State

As partially described earlier, the power supply circuit 4 transitions to the OFF state in response to the OFF control component 13 receiving from the pulse generator circuit 14 a pulse signal equal to or higher than the voltage of the battery 4*a* (second operation) as illustrated in FIG. 3. In response to receiving a pulse signal as such, the OFF control component 13 applies a pulse voltage to the OFF terminal 10*d* to set the power keep circuit 10 to the OFF state (that is, a blocked state).

The above operation stops the power supply circuit 4 from feeding electric power to the data collector 1, the wireless communicator 2, and the main controller 3. The power keep circuit 10 remains in the blocked state afterwards.

Power Supply Circuit Transitioning to OFF State (Variation)

Figure 6:
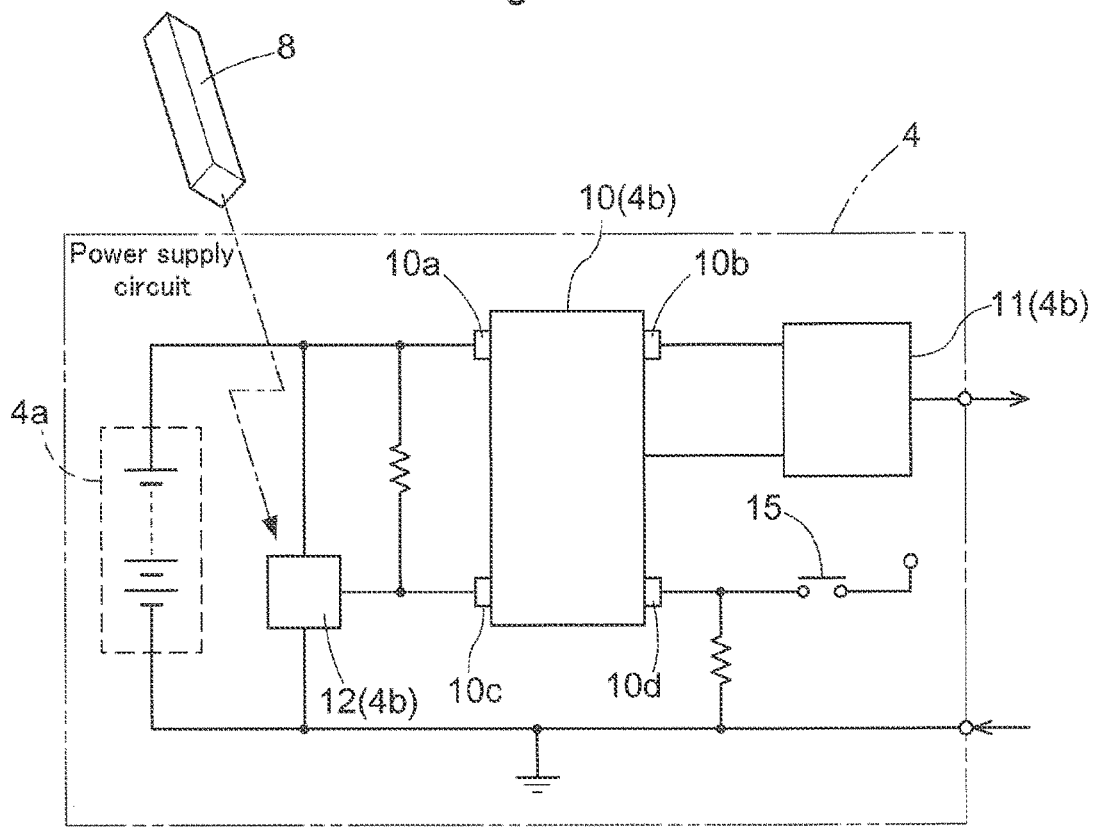
FIG. 6 is a circuit diagram illustrating a power supply circuit as a variation.

Instead of using a pulse signal to the OFF terminal 10*d*, the information collector unit A may, as illustrated in FIG. 6, include an OFF switch 15 disposed inside the housing 5 and configured to be pressed (second operation) to allow the battery 4*a* to apply its voltage to the OFF terminal 10*d*. The OFF switch 15 of this variation is a membrane switch including a press section covered by a resin layer to allow the user to manually bring the electric contact into conduction from outside the housing 5. This ensures hermeticity of the housing 5. The OFF switch 15 may alternatively be a mechanical switch, in which case the housing 5 is provided with a seal or the like for hermeticity.

The data collector 1 may operate over an extended period of time with the power supply circuit 4 in the energized state (that is, the ON state). In view of such operation, the power supply circuit 4 may need to transition to the OFF state for such purposes as maintaining and repairing the data collector 1.

To allow the user to perform an operation (second operation) to cause the power supply circuit 4 to transition to the OFF state, the information collector unit A may be alternatively varied to include, inside the housing 5, an OFF control component 13 or a switch for turning off the power supply circuit 4 (which switch is configured similarly to the OFF switch 15), and further varied such that the housing is openable. With this alternative variation, the user opens the housing 5 and causes the OFF control component 13 to receive a pulse signal from the pulse generator circuit 14 or manually presses the switch for turning off the power supply circuit 4 to cause the power supply circuit 4 to transition to the OFF state.

Advantages of Embodiments

The above configuration allows the user to insert the permanent magnet 8 into the recess 5a in the housing 5 to cause the power supply circuit 4 to transition to the ON state just before the user starts to use the information collector unit A. The above configuration also allows the user to cause the OFF control component 13 to receive a pulse signal from a pulse generator circuit 14 outside the housing 5 and thereby cause the power supply circuit 4 to transition to the OFF state to end the use of the information collector unit A. This in turn allows the power supply circuit 4 to be in the ON state only while the user is using the information collector unit A, thereby reducing the consumption of electric power of the battery 4a and saving energy.

The above configuration ensures hermeticity of the housing 5 while allowing the user to operate the information collector unit A from outside the housing 5 to cause the power supply circuit 4 to transition to the ON state and the OFF state. The above configuration also allows the user to check the indicator 6 to appropriately perceive whether the power supply circuit 4 is in the ON state or the OFF state.

The information collector unit A is, in particular, configured such that the housing 5 has a recess 5a configured to receive the permanent magnet 8 and does not need, for example, a through hole or a slit. Further, the OFF control component 13, which is configured to cause the power supply circuit 4 to transition to the OFF state, is insert-molded with, fixedly bonded to, or otherwise integrated with the housing 5 in such a manner as to have an end disposed on the outer surface of the housing 5. This ensures hermeticity of the housing 5.

The above configuration involves use of a permanent magnet 8 for the operation to cause the power supply circuit 4 to transition to the ON state. This prevents the power supply circuit 4 from transitioning to the ON state unintentionally in response to an operation such as a pressure being applied to the outer surface of the housing 5. This in turn allows effective power saving.

The shutter 9, which is configured to block and unblock the opening of the recess 5a, is made of a ferromagnet. For instance, the shutter 9, when blocking the opening of the recess 5a, prevents the Hall device 12 from receiving the action of the magnetism of the permanent magnet 8 or another unintended magnet being close to the recess 5a. The shutter 9 thereby prevents the power supply circuit 4 from transitioning to the ON state unintentionally.

The information collector unit A is configured to (i) perform, with use of millimeter waves, a sensing operation such as measuring the distance between a target object and itself or determining whether a target object is present or absent and (ii) transmit information obtained through the sensing operation to an external device with use of the wireless communicator 2. This configuration allows the user to receive such information without use of a communication cable. The information collector unit A may alternatively be configured to use ultrasonic waves instead.

Alternative Embodiments

This disclosure may be configured as below in addition to the embodiments described above. Any element described below that functions as described for the embodiments above is assigned with the same reference numeral as that for embodiments above.

(a) The output controller 4b includes an optical sensor (which is configured to sense light) such as a photodiode or a phototransistor. Emitting a light beam to the optical sensor from outside the housing 5 decreases the potential of the ON terminal 10c of the power keep circuit 10 and thereby causes the power supply circuit 4 to transition to the ON state.

Alternative embodiment (a) may include (i) a filter provided for the optical sensor and configured to selectively allow a light beam with a particular wavelength to pass therethrough for a non-contact operation, (ii) a housing 5 with a transparent window, and (iii) a semiconductor laser as a light source configured to emit a light beam with the particular wavelength.

Alternative embodiment (a) may include (i) an optical sensor insert-molded with, fixedly bonded to, or otherwise integrated with the housing 5, (ii) a light beam transmissive section configured to allow a light beam to be incident on the optical sensor, and (iii) an opening and closing section configured to switch the light beam transmissive section between an open state, in which the light beam transmissive section allows a light beam to pass therethrough, and a closed state, in which the light beam transmissive section blocks a light beam. Moving the opening and closing section to an open position causes the light beam transmissive section to allow a light beam to be incident on the optical sensor from outside the housing 5, thereby causing the power supply circuit 4 to transition to the ON state.

Figure 7:
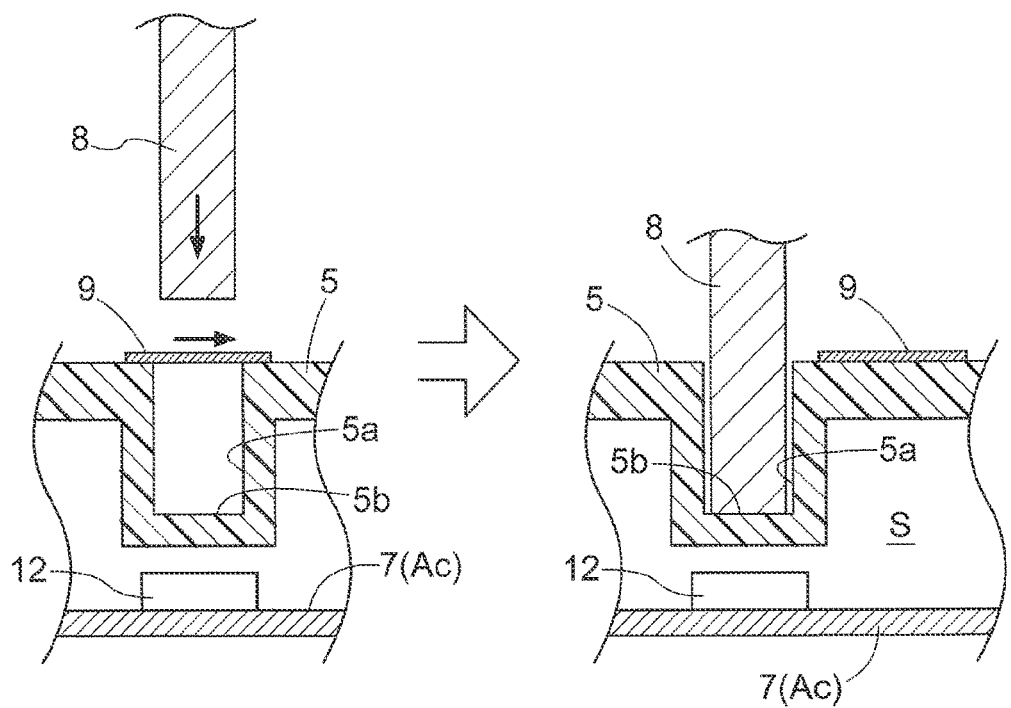
FIG. 7 is a cross-sectional diagram illustrating a shutter for alternative embodiment (b).

(b) As illustrated in FIG. 7, the shutter 9 is held slidably on the outer surface of the housing 5. Alternative embodiment (b) is configured such that as illustrated in the left half of FIG. 7, the shutter 9 is held at such a position as to cover the opening of the recess 5a due to the urging force of a spring (not illustrated) when the permanent magnet 8 is not to be inserted into the recess 5a and that as illustrated in the right half of FIG. 7, the shutter 9 is manually slidable to a position away from the opening of the recess 5a when the permanent magnet 8 is to be inserted into the recess 5a.

Alternative embodiment (b) is configured such that the shutter 9 is made of a ferromagnet as in the embodiment described above under "Description of Embodiments". The shutter 9 thus prevents the Hall device 12 from receiving the action of the magnetism of the permanent magnet 8. The shutter 9 also serves to prevent dust from entering the recess 5a.

Alternative embodiment (b) may include a shaft held on the outer surface of the housing 5 and holding the shutter 9 in such a manner that the shutter 9 is swingable and slidable along the outer surface of the housing 5.

Alternative embodiment (b) may be configured such that the housing 5 has a recess 5a on a side surface thereof which recess 5a recedes in a direction parallel to the mount surface of the substrate 7 and that inserting the permanent magnet 8 into the recess 5a and bringing it into contact with the bottom wall 5b causes its magnetism to act on the Hall device 12.

(c) The circuit module Ac may include, in the data collector 1, a sensor such as an optical sensor, a temperature sensor, or a sensor configured to detect a particular gas or dust in the air to function as an environment determining sensor.

(d) This alternative embodiment includes a rechargeable, secondary battery as the battery 4a and a solar photovoltaic power generator unit disposed outside the housing 5 and configured to generate power with use of sunlight and charge the battery 4a. This configuration further effectively reduces the consumption of electric power of the battery 4a.

(e) This alternative embodiment includes a notifier such as a loudspeaker or a buzzer disposed on the housing 5 and configured to, when the power supply circuit 4 has transitioned to the ON state, notify the user of the transition with use of a voice or a buzzing sound. Such a notifier allows the user to perceive audibly that the power supply circuit 4 has transitioned to the ON state.

(f) The circuit module Ac is also usable in a wearable device or an IoT device.

The invention claimed is:

1. An electric device, comprising:
an electric circuit;
a power supply circuit configured to feed electric power to the electric circuit and stop the feed; and
a housing containing the electric circuit and the power supply circuit in an internal space,
the power supply circuit including:
a battery; and
an output controller configured to control an output of the battery,
the output controller including a magnetic sensor configured to detect magnetism and a power keep circuit,
the output controller being configured to,
in response to a first operation performed from outside the housing while the power supply circuit is in an OFF state, the OFF state being a state in which the battery feeds no electric power to the electric circuit, cause the power supply circuit to transition to an ON state, the ON state being a state in which the battery continuously feeds electric power to the electric circuit even after an end of the first operation,
in response to a second operation performed while the power supply circuit is in the ON state, cause the power supply circuit to transition to the OFF state,
the first operation is an operation of bringing a magnet close to the magnetic sensor outside the housing,
the magnetic sensor functions as a switch configured to cause the output controller to transition to the ON state in response to detecting magnetism of the magnet when the magnet is close to the magnetic sensor,
the power keep circuit includes an ON terminal connected to the magnetic sensor and configured to change its potential when the magnet is close thereto, and
the power keep circuit is configured so that when the magnet is close to the magnetic sensor, the potential of the ON terminal is changed to cause the power supply circuit to transition to an ON state, and when the magnet is separated from the magnetic sensor and magnetism does not act on the magnetic sensor after the power supply circuit transitions to the ON state, the power supply circuit remains in the ON state.

2. The electric device according to claim 1, wherein the housing is hermetically structured to prevent liquid and dust from entering the internal space.

3. The electric device according to claim 1, wherein the housing has a recess configured to receive the magnet such that inserting the magnet into the recess brings the magnet close to the magnetic sensor.

4. The electric device according to claim 3, wherein the recess is in a form of a cylinder including a bottom wall into and out of which cylinder the magnet is capable of being linearly inserted and pulled out, and the bottom wall is so positioned relative to the magnetic sensor, and the magnet has a magnetic intensity so adjusted, that bringing the magnet into contact with the bottom wall causes the magnetism of the magnet to act on the magnetic sensor to cause the output controller to transition to the ON state.

5. The electric device according to claim 3, wherein the housing is provided with a shutter configured to, when the magnet is not in the recess, block an opening of the recess and, when the magnet is inserted into the recess, change an orientation in such a manner as to allow the magnet to be inserted into the recess.

6. The electric device according to claim 4, wherein the housing is provided with a shutter configured to, when the magnet is not in the recess, block an opening of the recess and, when the magnet is inserted into the recess, change an orientation in such a manner as to allow the magnet to be inserted into the recess.

7. The electric device according to claim 1, wherein the electric circuit includes:
a data collector configured to collect data; and
a wireless communicator configured to transmit, to an external device outside the housing, a radio signal indicative of the data that the data collector has collected.

8. The electric device according to claim 2, wherein the electric circuit includes:
a data collector configured to collect data; and
a wireless communicator configured to transmit, to an external device outside the housing, a radio signal indicative of the data that the data collector has collected.

9. The electric device according to claim 3, wherein the electric circuit includes:
a data collector configured to collect data; and
a wireless communicator configured to transmit, to an external device outside the housing, a radio signal indicative of the data that the data collector has collected.

10. The electric device according to claim 1, further comprising:
a notifier configured for notification that the power supply circuit has transitioned to the ON state.

11. The electric device according to claim 1, further comprising:
an OFF control component made of a bar-shaped good electric conductor, wherein
one of ends of the OFF control component is connected to an OFF terminal of the power keep circuit and the other end is exposed from an outer surface of the housing,
the second operation is an operation of inputting a voltage signal into the OFF control component from outside the housing, and
the output controller is set to the OFF state by inputting the voltage signal into the OFF terminal, inputted into the OFF control component by the second operation.

12. The electric device according to claim 1, wherein the output controller includes an optical sensor configured to detect a light beam, and
the first operation is an operation of causing the output controller to cause the optical sensor to detect a light beam from a light source outside the housing.

13. The electric device according to claim 1, wherein the power keep circuit is in the form of a packaged circuit including semiconductor devices.

14. The electric device according to claim 1, wherein the power keep circuit includes an input terminal, an output terminal, an ON terminal, and an OFF terminal.

15. The electric device according to claim 14, wherein the input terminal receives electric power from the battery, an output is released from the output terminal, and the ON terminal receives a control signal or zero-potential signal to transition to an ON or energized state.

16. The electric device according to claim 15, wherein the ON terminal is coupled to the magnetic sensor, the output controller includes a regulator coupled to the output terminal, and the power supply circuit includes an OFF control component coupled to the OFF terminal at one end and exposed from the housing at an opposite end.

* * * * *